(12) United States Patent
Ruppi

(10) Patent No.: US 6,221,469 B1
(45) Date of Patent: Apr. 24, 2001

(54) GRADE FOR STEEL

(75) Inventor: Sakari Ruppi, Fagersta (SE)

(73) Assignee: Seco Tools AB, Fagersta (SE)

( * ) Notice: Subject to any disclaimer, the term of this patent is extended or adjusted under 35 U.S.C. 154(b) by 0 days.

(21) Appl. No.: 09/207,687

(22) Filed: Dec. 9, 1998

(51) Int. Cl.$^7$ .................................................. B32B 9/00
(52) U.S. Cl. .................... 428/216; 428/336; 428/325; 428/323; 428/697; 428/698; 428/699; 428/701; 428/702
(58) Field of Search .................... 428/216, 336, 428/697, 698, 699, 701, 702, 323, 325

(56) References Cited

U.S. PATENT DOCUMENTS

| | | | | |
|---|---|---|---|---|
| 4,714,660 | * | 12/1987 | Gates, Jr. ............................ | 428/698 |
| 5,137,774 | | 8/1992 | Ruppi .................................. | 428/216 |
| 5,635,247 | | 6/1997 | Ruppi . | |
| 5,652,045 | * | 7/1997 | Nakamura et al. ................. | 428/216 |
| 5,700,569 | | 12/1997 | Ruppi . | |
| 5,786,069 | | 7/1998 | Ljungberg et al. ................. | 428/216 |
| 5,871,850 | * | 2/1999 | Moriguchi et al. ................. | 428/332 |
| 5,879,823 | * | 3/1999 | Prizzi et al. ........................ | 428/697 |
| 5,915,162 | * | 6/1999 | Uchino et al. ...................... | 428/699 |
| 5,920,760 | * | 7/1999 | Yoshimura et al. ................. | 428/698 |

FOREIGN PATENT DOCUMENTS

| | | | |
|---|---|---|---|
| 0 594 875 | * | 5/1994 | (EP) . |
| 0 600 115 A1 | | 6/1994 | (EP) . |
| 0 600 115 | * | 6/1994 | (EP) . |
| 0 685 572 A2 | | 12/1995 | (EP) . |
| 0 693 574 | * | 1/1996 | (EP) . |

OTHER PUBLICATIONS

S. Ruppi et al., "Wear Characteristics of TiC, TiCN, TiN and $Al_2O_3$ Coatings in the Turning of Conventional and Ca–Treated Steels", *International Journal of Refractory Metals & Hard Materials*, to be published (No Month/Date).

D.G. Cahill et al., "Thermal Conductivity of $\kappa$–$Al_2O_3$ and $\alpha$–$Al_2O_3$ Wear Resistant Coatings", *Journal of Applied Physics*, vol. 83, No. 11, Jun. 1, 1998.

S. Vuorinen et al., "Phase Transformation in Chemically Vapour Deposited $\kappa$–$Al_2O_3$", *Thin Solid Films*, 214(1992) pp. 132–143 (No Month).

Vuorinen et al., "TEM Study of Microstructure and Crystallography at the TiC/Cemented Carbide Interface", *Science of Hard Materials*, 1983, pp. 433–447 (No Month).

Vuorinen et al., "Interfacial Characterization of Chemically Vapour Deposited Titanium Carbide on Cemented Carbide", *Thin Solid Films*, 232 (1993) pp. 73–82 (No Month).

* cited by examiner

*Primary Examiner*—Archene Turner
(74) *Attorney, Agent, or Firm*—Burns, Doane, Swecker & Mathis, L.L.P.

(57) ABSTRACT

An improved coated cemented carbide insert for the cutting of steel is provided. The insert has multi-layer TiCN between the substrate and the $\kappa$-$Al_2O_3$ coating. The innermost portion of the TiCN layer is composed of large columnar grains while the outermost portion is of small equiaxed grains. Above the $\kappa$-$Al_2O_3$, another columnar Ti(C,N) layer is applied.

19 Claims, 4 Drawing Sheets

FIG. 2 Coating No. 1, Ti(C,N) after turning for 2 minutes.
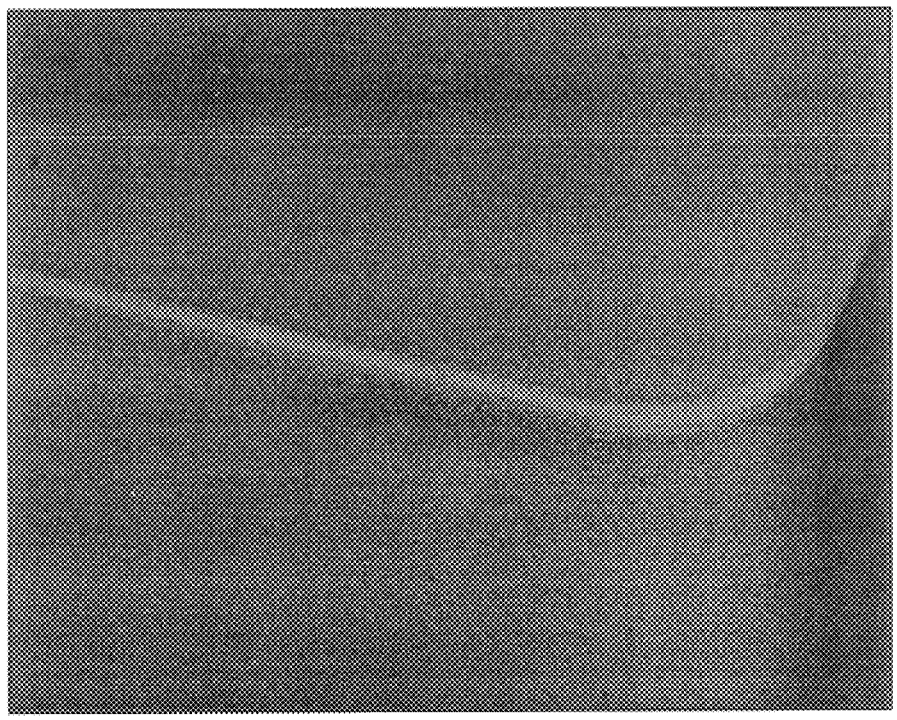
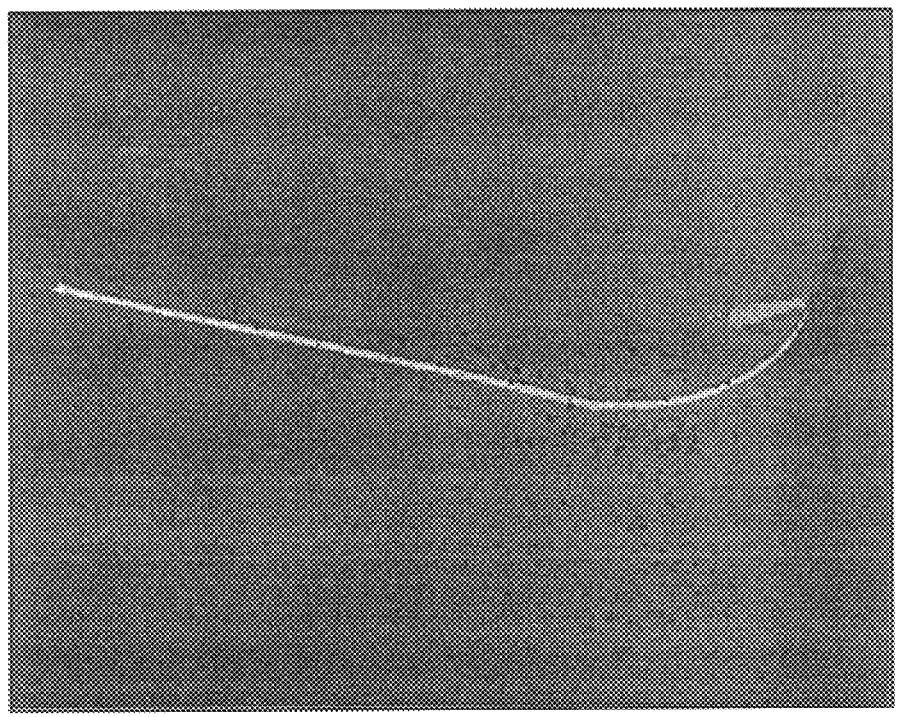
FIG. 3 Coating No. 2, ($Al_2O_3$) after turning for 2 minutes.

FIG. 4 Coating No. 1, Ti(C,N) after turning for 15 minutes.
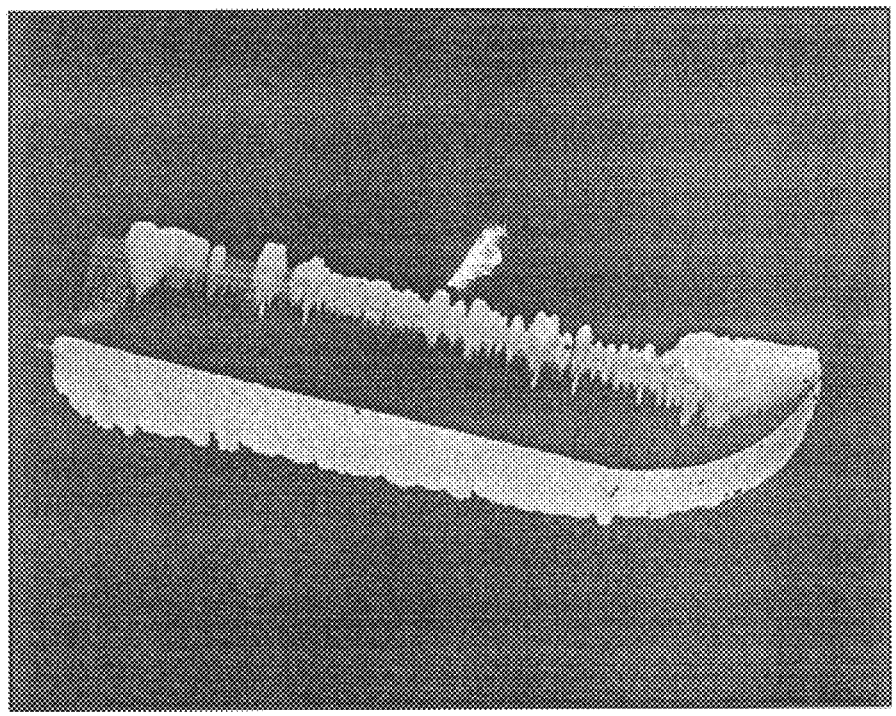
FIG. 5 Coating No. 2, (Al$_2$O$_3$) after turning for 13 minutes.

FIG. 6 Coating No. 1, after turning for 12 minutes.
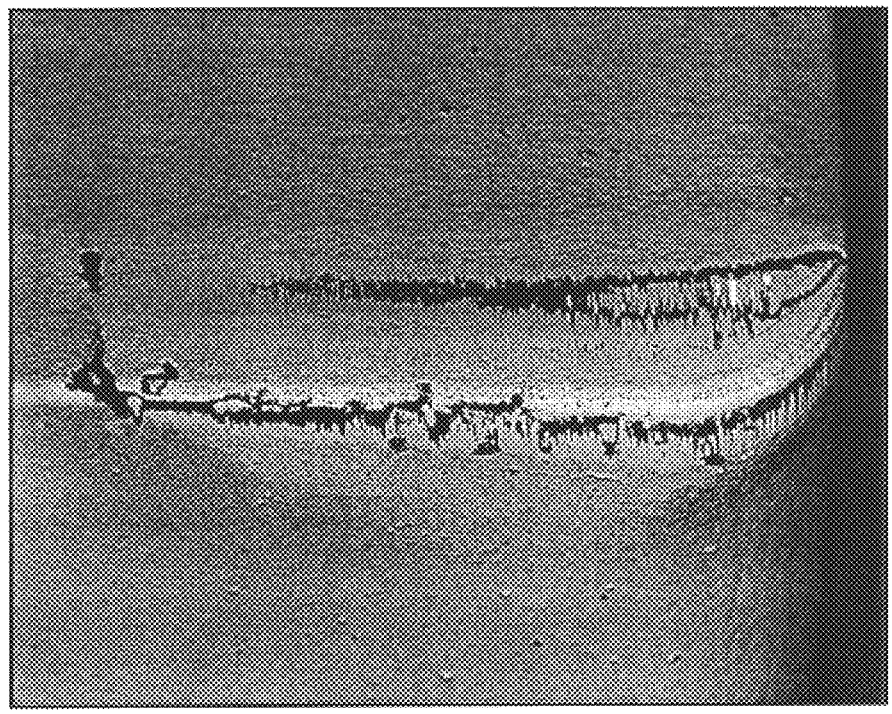
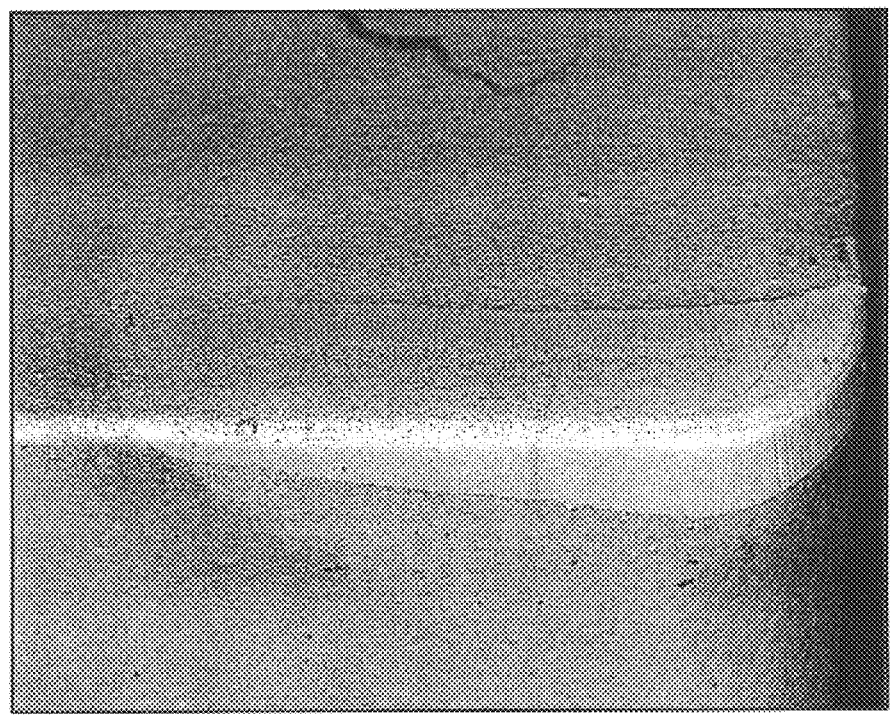
FIG. 7 Coating No. 2, after turning for 6 minutes.

GRADE FOR STEEL

BACKGROUND OF THE INVENTION

When turning many low-carbon steels, medium-carbon steels or low-alloy steels with coated cemented carbide inserts, $Al_2O_3$ is not the best coating material. The present author has studied the behavior of different coating materials, for example in cutting ferritic pearlitic steels (S. Ruppi, Internal Report) and martensitic quenched and tempered steels both with and without Ca-treatment, (S. Ruppi et al., "Wear Characteristics of TiC, TiCN, TiN and $Al_2O_3$ Coatings in the Turning of Conventional and Ca-Treated Steels", International Journal of Refractory Metals & Hard Materials, to be published). In the cutting of these workpiece materials with cemented carbide inserts with various coatings, the $Al_2O_3$ layers could be characterized as being the worst coating material. It has also been noticed that $\alpha$-$Al_2O_3$ does not exhibit better wear properties than $\kappa$-$Al_2O_3$ in steel, although $\alpha$-$Al_2O_3$ is better in cast iron. It should, however, be noted that $Al_2O_3$ was used among the best coating materials together with TiN as far as notch wear was concerned. In use, $\kappa$-$Al_2O_3$ is harder on the flank face (where it does not transform into $\alpha$-$Al_2O_3$). On the rake face, it will transform relatively fast into $\alpha$-$Al_2O_3$, thus exhibiting the same properties as $\alpha$-$Al_2O_3$ on the rake face. Also, $\kappa$-$Al_2O_3$ has a lower conductivity than $\alpha$-$Al_2O_3$. In fact, the thermal conductivity of $\kappa$-$Al_2O_3$ is ⅓ of that of $\alpha$-$Al_2O_3$ (D. G. Gahill et al., "Thermal Conductivity of $\kappa$-$Al_2O_3$ and $\alpha$-$Al_2O_3$ Wear Resistant Coatings", Journal of Applied Physics, vol. 83, no. 11, 1 June 1998). This means that the $\kappa$-$Al_2O_3$ phase can be applied as an effective thermal barrier and should in this respect, be preferred to $\alpha$-$Al_2O_3$. This is important in steel cutting where high temperatures are encountered and, in those applications where it is important to reduce the temperature flow into the substrate. Consequently, the plastic deformation of the substrate can be reduced. The $Al_2O_3$ layer has to be protected from wear in steel, i.e., a relatively thick coating of, for example, TiCN, which has been found to be the best coating material in steel, has to be deposited atop it. Further, the coating on $\kappa$-$Al_2O_3$ must be deposited at a relatively low temperature than that of conventional CVD in order to avoid the phase transformation of the metastable $\kappa$-$Al_2O_3$ into $\alpha$-$Al_2O_3$. It is well-known that the $\kappa$ to $\alpha$ transformation is very temperature sensitive. See, for example, FIG. 5 in S. Vuorinen et al., "Phase Transfornation in Chemically Vapour Deposited $\kappa$-$Al_2O_3$", Thin Solid Films, 214(1992) pp. 132–143.

In U.S. Pat. No. 5,137,774, the increased performance of $\alpha$-$Al_2O_3$ as compared to $\kappa$-$Al_2O_3$ as a coating on a cemented carbide insert when turning cast iron was shown. In addition, in U.S. Pat. Nos. 5,635,247 and 5,700,569 and 6,015,614, various $Al_2O_3$-coated cemented carbide inserts in which the $Al_2O_3$ is deposited on a Ti(C,N) layer or multilayers are shown. However, in tests as conducted by the present inventor, it was noted that the adhesion of an $\alpha$-$Al_2O_3$ layer to the underlying TiCN layer as well as the adhesion of the TiCN layer to the cemented carbide substrate was often unsatisfactory when the insert was used in the turning of cast iron. The coating failed due to edge chipping which resulted in accelerated wear.

The main reasons for edge chipping have been identified by the present inventor from these tests to be the weak substrate-coating adhesion as well as the weak bond between TiCN and $\alpha$-$Al_2O_3$.

In one study of the TiC-cemented carbide interface of a 6 $\mu$m thick CVD-deposited TiC layer by Vuorinen et al., "TEM Study of Microstructure and Crystallography at the TiC/Cemented Carbide Interface", Science of Hard Materials, 1983, pp. 433–447, it was found by transmission electron microscopy (TEM) that the TiC layer is composed of two regions. Close to the substrate and extending to a thickness of 1.5–2 $\mu$m is a layer of fine, equiaxed TiC grains. Above that is a layer of larger (typically 2–4 $\mu$m) grains of TiC.

In another study published in Thin Solid Films, 232 (1993) pp. 73–82, Vuorinen et al., entitled "Interfacial Characterization of Chemically Vapour Deposited Titanium Carbide on Cemented Carbide", TiC coatings were CVD-deposited on cemented carbide substrates under non-carburizing conditions. In the absence of $\eta$-carbide, it was found that the TiC nucleated and grew epitaxially on both $\{0001\}$- and $\{10\bar{1}0\}$-WC planes.

The search is continued for improved coatings for coated cemented carbide inserts for cutting steel bodies.

OBJECTS AND SUMMARY OF THE INVENTION

It is an object of this invention to avoid or alleviate the problems of the prior art.

It is further an object of this invention to provide an improved coated cemented carbide insert for the cutting of steel.

In one aspect of the invention there is provided a coated cemented carbide body comprising a cemented carbide substrate, a multilayer Ti(C,N) intermediate layer wherein the Ti(C,N) intermediate layer comprises a first, inner layer of columnar grained Ti(C,N) and a second, outer layer of Ti(C,N), a layer of $Al_2O_3$ and atop the $Al_2O_3$, another layer of columnar grained Ti(C,N).

In another aspect of the invention there is provided a coated cemented carbide body comprising a cemented carbide substrate having a series of sequential layers thereon, said layers in order from the substrate being:

(a) a bonding layer having a thickness of up to 1 $\mu$m selected from the group consisting of TiC, TiN and Ti(C,N);

(b) a multilayer TiCN layer comprising a first, inner layer of columnar grained Ti(C,N) having a grain size where the width of the said grains is from 0.1–0.15 times the coating layer thickness and the length of said grains is from 0.5–0.8 times the coating layer thickness, and a second, outer layer of equiaxed grains having a grain size of from 0.2 to 1.0 $\mu$m, the total thickness of the Ti(C,N) layer being from 5 to 10 $\mu$m;

(c) a layer of (TiAl)(CO) having a thickness of from about 0.5 to 3 $\mu$m;

(d) an $\kappa$-$Al_2O_3$ layer having a thickness of from about 2 to 4 $\mu$m;

(e) a layer of (TiAl)(CO) having a thickness of from about 2–4 $\mu$m;

(f) a layer of columnar grained Ti(C,N) having a grain size where the width of the said grains is from 0.1 to 0.5 times the coating layer thickness and a length of 0.5 to 0.8 times the coating layer thickness, the layer having a thickness for 2 to 8 $\mu$m; and (g) an outer layer of about 1 $\mu$m or less thickness of TiN.

BRIEF DESCRIPTION OF THE DRAWINGS

FIGS. 2, 3, 4, and 5 are SEM photographs of two comparative inserts after cutting times of 2 and 9 minutes, respectively.

FIGS. 6 and 7 are SEM photographs of an insert of the present invention and a comparative insert after 12 and 6 minutes of turning, respectively.

DETAILED DESCRIPTION OF THE PREFERRED EMBODIMENTS OF THE INVENTION

Figure 1:
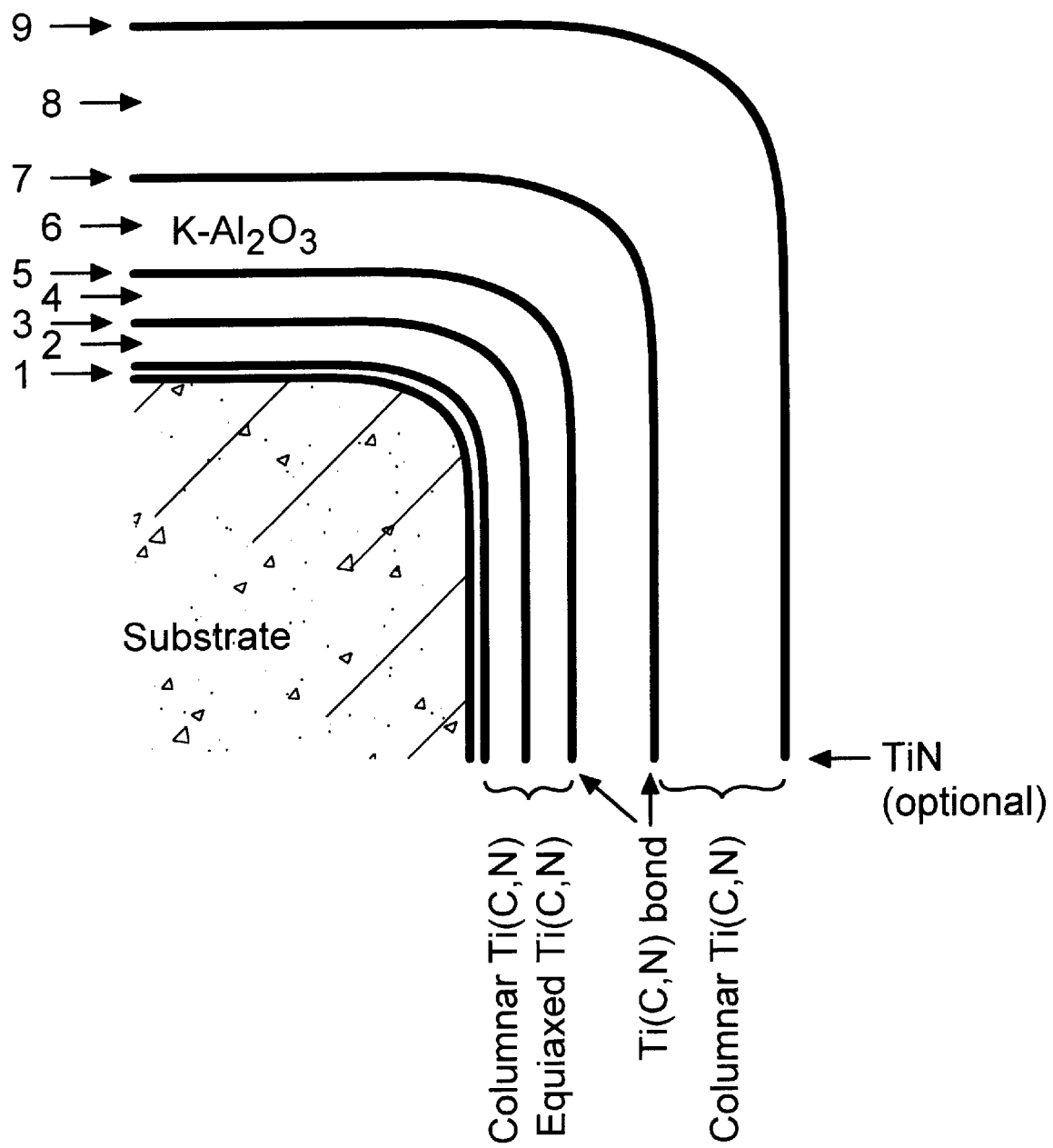
FIG. 1 shows a schematic representation of a cross-section taken of a corner of a coated cemented carbide insert of the present invention.

The main phases contained in cemented carbides are WC and Co-rich binder phase. An optional third phase of cubic transition metal carbides (Ti, Ta, Nb, W, C), usually referred to as the γ phase, may be added to improve the wear resistance of straight WC-Co alloys. Regardless, WC is the main constituent in many commercial cemented carbides. WC has a simple hexagonal crystal structure with two atoms per unit cell: W at (0,0,0) and C at (⅔, ⅓, ½).

The basic equilibrium form of WC as a result of liquid phase sintering is a triangular grain bounded by three {1010} and two {1000} planes. The substrate-coating interface is consequently composed of the following interfaces:

coating—WC
coating—Co
coating—γ(when present)
coating—η(when formed)

In-house TEM observations have revealed that the TiCN and TiN coating grow epitaxially on the interfacial WC grains as does TiC, which can also be used. The epitaxial coating-WC interfaces thus formed are dominating and are responsible for the good adhesion of the first coating to the cemented carbide substrate. This is especially the case when chemical cleaning is applied to the substrate before the coating process. This situation is complicated, however, due to the reversible η-phase reaction, as discussed below.

The two phase region in WC-Co (or three phase region in WC-Co-γ) cemented carbides is very narrow with respect to the C-content of the alloy and a very small change in the C-content will result in three-phase field alloy (or four phase field alloy in WC-Co-γ) and an η-carbide being formed at reduced C-contents. See, for example, FIG. 1 of page 74 of the *Thin Solid Films* article mentioned above. Consequently, when a Ti(C and/or N) layer is applied using a conventional CVD technique, the carbon for the formation of TiC, TiCN or TiN (at low pressure) will be taken partly from the substrate, the substrate being decarburized. The outer part of the substrate is consequently transformed into a $M_{12}C$ type of η-phase. This η-phase is always formed (even though it may be very thin) at least at the edges of the coated inserts (where the surface-bulk ratio is highest resulting in the highest degree of decarburization).

It is emphasized that this η-phase reaction is reversible, especially when relatively thin, and when applied on the substrates with relatively a high carbon content. Consequently, during annealing, the eta-phase will transform back to Co-rich alloy and WC. As evident from the above, this situation is very pronounced at the cutting edges.

According to the prior art, layers of $Al_2O_3$ having a thickness of 4–8 μm should preferably be used for steel. The $Al_2O_3$ layer is applied on a TiCN layer. The substrate—TiCN—interface is subjected to a heat treatment of a duration of up to six hours during deposition of the $Al_2O_3$ layer. During the deposition of the $Al_2O_3$ layer, the reversible η-carbide reaction will occur at the substrate-coating interface, resulting in the formation of a Co-rich layer between the TiCN coating and the cemented carbide substrate. This is particularly the case when the η-phase formation has been limited to near-surface regions of the substrate, as is the case at the case when the modern CVD processes are concerned. As a result, the epitaxial TiCN-WC interfaces will be substituted by coating-Co interfaces, resulting in reduced adhesion.

In order to avoid this, the first TiCN layer has to be deposited without decarburization of the substrate. This coating layer is deposited using $CH_3CN$ and $CH_4$ gases as precursors. A coating layer which exhibits a columnar structure is formed as a result. The columnar grains have a width of 0.1–0.5× the coating layer thickness (that is, generally a width 0.1–0.5 μm) and a length of 0.5–0.8× the coating layer thickness (that is, generally a length of 0.5–2.9 μm). To optimize the amount of epitaxial interfaces and ensure a good adhesion at the interface, the process should be started with a first layer of TiCN, TiC or TiN deposited without $CH_3CN$ and having a very short duration sufficient to form a layer having a thickness of up to 1 μm, preferably up to about 0.5 μm. Diffusion of tungsten will occur into this interfacial layer. This interdiffusion, resulting in a reduced misfit at the coating-WC interface is important for adhesion.

The columnar TiCN layer obtained exhibits, however, an insufficient adhesion to the $Al_2O_3$ layer even though bonding layers were applied. In order to improve the bonding adhesion, a CVD TiCN layer composed of equiaxed grains atop the coating of columnar TiCN grains is applied. The grain size of the equiaxed grain is from 0.2 to 1.0 μm. On this equiaxed grained-layer, a bonding layer can be successfully applied resulting in clearly increased adhesion. This total TiCN layer is composed of clearly defined layers of columnar and equiaxed grains of TiCN and has a thickness of from 5 to 10 μm, preferably from 2 to 4 μm.

The bonding layer is a cubic layer of Ti(CO) containing Al. It is important to control this bonding layer so that a whisker-like morphology at the bonding-$Al_2O_3$ interface is obtained. The correct chemistry and microstructure of this layer is controlled by adjusting the $TiCl_4$ and $AlCl_3$ ration of the precursors. At the correct ratio, a whisker-like growth is obtained and up to 10 at % Al in the bonding layer can be found in the bonding layer.

Atop the bonding layer, a κ-$Al_2O_3$ layer having a thickness of from about 2 to 4 μm, preferably about 3 μm. The layer of κ-$Al_2O_3$ is used as a thermal barrier layer to prevent heat flow into the substrate. The κ-$Al_2O_3$ is protected by the TiCN layer deposited atop of it. The κ-$Al_2O_3$ is deposited in accordance with conventional techniques such as disclosed in U.S. Pat. No. 5,635,247.

Another bonding layer of cubic (TiAl)(CO) as described above can be applied above the κ-$Al_2O_3$ layer.

Thereafter, a layer of columnar grained TiCN having columnar grains of a length and width as that described before is applied.

Optionally, a thick layer of TiN can be applied as the outermost layer.

An optimized coating for steel should then be tailored as follows (FIG. 1):

1. CVD bonding layer 1 composed of TiC, TiCN or TiN deposited directly on a chemically cleaned substrate where protruding WC grains are dominating. This kind of substrate may also be obtained by modified sintering processes. This layer is characterized by the fact that diffusion of W has occurred in this layer and by epitaxial coating-WC interfaces. The epitaxial orientation relationships are as follows:

Thickness: up to 1 μm, preferably 0.5 μm.

2. The CVD TiCN layer 2 composed of columnar crystals. This layer is deposited using $CH_3CN$ and $CH_4$ as precursors.

The decarburization of the substrate is avoided, η-carbide is not formed, and the possibility for the reversible η-carbide reaction to occur is eliminated.

3. An optional layer 3 of TiN.
4. The CVD TiCN layer 4 composed of equiaxed crystal deposited atop the MTCVD layer composed of columnar crystals.

The total thickness of the layers 2 and 4 is from 2 to 4 $\mu$m, preferably 3 $\mu$m. The thickness of the columnar TiCN layer is from 1 $\mu$m up to 90% of the total thickness of the TiCN layers (layers 2 and 4) depending on the carbon content of the substrate.

5. Bonding layer 5 composed of cubic (TiAl)(CO). Thickness from 0.5 to 3.0 $\mu$m, preferably 1.5 $\mu$m.
6. κ-Al$_2$O$_3$ coating 6 having a thickness of 2 to 4 $\mu$m, preferably 3 $\mu$m. The layer of κ-Al$_2$O$_3$ is here used as a thermal barrier layer to prevent the heat flow into the substrate. κ-Al$_2$O$_3$ is protected by the TiCN layer deposited atop of it.
7. (TiAl)(CO) 7 bond similar to step 5.
8. The CVD TiCN layer 8 composed of columnar crystals deposited atop the κ-Al$_2$O$_3$ via the bonding layer.
Thickness 2–8 $\mu$m, preferably 4–6 $\mu$m.
9. TiN layer 9, thickness $\leq$1 $\mu$m.

The invention is additionally illustrated in connection with the following Examples which are to be considered as illustrative of the present invention. It should be understood, however, that the invention is not limited to the specific details of the Examples.

EXAMPLE 1 (COMPARATIVE)

Two samples were deposited. In this case, the samples were single layers of κ-Al$_2$O$_3$ and MTCVD TiCN. The κ-Al$_2$O$_3$ layer was deposited applying a thin intermediate layer of TiCN between the Al$_2$O$_3$ layer and the substrate. This layer was less than 1 $\mu$m. The total thickness of the coating layers were 7 $\mu$m.

Coating No. 1: MTCVD TiCN, thickness 7 $\mu$m
Coating No. 2: κ-Al$_2$O$_3$, thickness 7 $\mu$m (+<1 $\mu$m TiCN)
Operation: Turning
Material: Steel SS1672
Cutting Speed: 200 m/min
Depth of Cut: 3.0 mm
Feed Rate: 0.3 mm/rev
Insert Geometry: SNUN 120408
No coolant was applied The cutting edges of the inserts were investigated by SEM after 2, 5, 7, 10 and 15 (Al$_2$O$_3$ after 13) minutes. FIGS. 3, 4, 5 and 6 show SEM micrographs of inserts 1 and 2 after cutting of 2 and 9 minutes, respectively.

Al$_2$O$_3$ became worn through on the flank face after turning for only 2 minutes, FIG. 4. The TiCN coating showed very good flank wear resistance, FIG. 3. Al$_2$O$_3$ was also the worst coating material with respect to crater wear even though it is commonly thought to be the best coating material in this respect. The Al$_2$O$_3$ layer exhibited extensive crater wear after 9 minutes, FIG. 5. The TiCN coating showed very limited crater wear after the same cutting time, FIG. 6. Consequently, the Al$_2$O$_3$ layer could be used only for 13 minutes, while the TiCN coated insert could have been used for longer than 15 minutes.

It should be noticed that with respect to notch wear, the Al$_2$O$_3$ outperformed the TiCN layer.

It must be clear from the above that the Al$_2$O$_3$ layer should not be used in steel, because of its wear properties (crater wear/flank wear). The Al$_2$O$_3$ layer should, however, be used in multilayer coating structures due to its low thermal conductivity and good resistance to notch wear. In order to be utilized, the Al$_2$O$_3$ coating in steel must be protected by a relatively thick layer of, for example, preferably TiCN, which is demonstrated in the following Example.

EXAMPLE 2

Two samples of the same thickness were deposited:
Coating No. 1
1. TiCN intermediate layer, thickness 2 $\mu$m, having a first columnar grained layer with the grains having a width of 0.25 $\mu$m and a length of 1.1 $\mu$m and a second equiaxed grained layer with the grains having a grain size of 0.5 $\mu$m, where the thickness of the columnar grained region was 1.8 $\mu$m
2. Bonding layer
3. κ-Al$_2$O$_3$ layer, thickness 4 $\mu$m
4. Bonding layer
5. MTCVD layer composed of columnar grains with the grains having a length of 2.4 $\mu$m and a width of 0.6 $\mu$m, thickness 4 $\mu$m, deposited atop the κ-Al$_2$O$_3$ layer. Deposition temperature was 850° C. and the phase transformation of κ-Al$_2$O$_3$ was avoided.

Coating No. 2 (Comparative)
1. TiCN layer, thickness 10 $\mu$m, with the grains having a length of 4.5 $\mu$m and a width of 0.9 $\mu$m, thickness of the columnar grained region was 6 $\mu$m.

Cutting tests were carried out in martensitic quenched and tempered steel.
Operation: Turning
Material: 42CrMo4
Cutting Speed: 260 m/min
Depth of Cut: 3.0 mm
Feed Rate: 0.3 mm/rev
Insert Geometry: SNUN120408
No coolant was applied

| Coating | Lifetime | Lifetime Criteria |
|---------|----------|-------------------|
| No. 1   | 15       | crater wear/flank wear |
| No. 2   | 6        | plastic deformation |

FIGS. 6 and 7 show SEM photographs of the inserts 1 and 2 after 12 and 6 minutes of turning, respectively. It is worth noticing that Insert No. 2 showed hardly any crater wear, but failed due to plastic deformation, which resulted in extensive flank wear, FIG. 6. Insert No. 1 exhibited less plastic deformation after much longer cutting time, FIG. 7. After 12 minutes, crate and flank wear had penetrated the TiCN coating and the oxide layer underneath was worn after that very quickly and the lifetime was about 15 minutes.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:
1. A coated cemented carbide body comprising a cemented carbide substrate, a multilayer Ti(C,N) intermediate layer wherein the Ti(C,N) intermediate layer comprises a first inner layer of columnar grained Ti(C,N) and a second outer layer of equiaxed Ti(C,N), the first inner columnar grained layer being closer to the substrate than the second outer equiaxed grained layer, a layer of $Al_2O_3$, and atop the $Al_2O_3$ another layer of columnar grained Ti(C,N).

2. The coated cemented carbide body of claim 1 wherein there is a TiN layer between the first and second layers of Ti(C,N).

3. The coated cemented carbide body of claim 1 wherein the total thickness of the Ti(C,N) intermediate layer is from 2 to 4 microns.

4. The coated cemented carbide body of claim 3 wherein the thickness of the columnar layer is from 1 micron up to 90% of the total thickness of the Ti(C,N) intermediate layer.

5. The coated cemented carbide body of claim 1 wherein there is a layer of (TiAl)(CO) between the second outer layer of the intermediate Ti(C,N) layer and the $Al_2O_3$ layer.

6. The coated cemented carbide body of claim 5 wherein the (TiAl)(CO) layer has a thickness of from about 0.5 to 3 microns.

7. The coated cemented carbide body of claim 1 wherein the $Al_2O_3$ layer has a thickness of from about 2 to 4 microns.

8. The coated cemented carbide body of claim 2 wherein there is a layer of (TiAl)(CO) between the TiCN layer and the $Al_2O_3$ layer.

9. The coated cemented carbide body of claim 1 wherein the $Al_2O_3$ is $\kappa$-$Al_2O_3$.

10. The coated cemented carbide body of claim 9 wherein the (TiAl)(CO) layer between the second outer Ti(C,N) layer and $\kappa$-$Al_2O_3$ layer has a thickness of from about 0.5 to 3 microns and the (TiAl)(CO) layer between the $\kappa$-$Al_2O_3$ layer and the TiCN layer is from 2 to 8 $\mu$m.

11. The coated cemented carbide body of claim 2 wherein there is a TiN layer over the outermost TiCN layer.

12. The coated cemented carbide body of claim 11 wherein the TiN layer has a thickness of about 1 micron or less.

13. The coated cemented carbide body of claim 1 wherein the grains of each of the columnar grained TiCN layers has a width of from 0.1 to 0.5 times the coating layer thickness and a length of 0.5 to 0.8 times the coating layer thickness.

14. The coated cemented carbide body of claim 13 wherein the coating layer thickness is from 2 to 8 $\mu$m.

15. The coated cemented carbide body of claim 13 wherein the grains of the equiaxed grained TiCN have a grain size of from 0.2 to 1.0 $\mu$m.

16. The method of cutting steel using a coated cemented carbide insert, the improvement comprising using as the insert, the insert of claim 1.

17. A coated cemented carbide body comprising a cemented carbide substrate having a series of sequential layers thereon, said layers in order from the substrate being:
   (a) a bonding layer having a thickness of up to 1 $\mu$m selected from the group consisting of TiC, TiN and Ti(C,N);
   (b) a multilayer TiCN layer comprising a first, inner layer of columnar grained Ti(C,N) having a grain size where the width of the said grains is from 0.1–0.15 times the coating layer thickness and the length of said grains is from 0.5–0.8 times the coating layer thickness, and a second, outer layer of equiaxed grains having a grain size of from 0.2 to 1.0 $\mu$m, the total thickness of the Ti(C,N) layer being from 5 to 10 $\mu$m;
   (c) a layer of (TiAl)(CO) having a thickness of from about 0.5 to 3 $\mu$m;
   (d) an $\kappa$-$Al_2O_3$ layer having a thickness of from about 2 to 4 $\mu$m;
   (e) a layer of (TiAl)(CO) having a thickness of from about 2–4 $\mu$m;
   (f) a layer of columnar grained Ti(C,N) having a grain size where the width of the said grains is from 0.1 to 0.5 times the coating layer thickness and a length of 0.5 to 0.8 times the coating layer thickness, the layer having a thickness for 2 to 8 $\mu$m; and
   (g) an outer layer of about 1 $\mu$m or less thickness of TiN.

18. A coated cemented carbide body comprising a cemented carbide substrate having a surface, the surface having a series of sequential layers disposed thereon, said layers comprising, in order beginning from the substrate surface:
   (a) a bonding layer selected from the group consisting of TiC, TiN and Ti(C,N);
   (b) a multi-layer TiCN layer comprising a first inner layer of columnar grained Ti(C,N), and a second outer layer of equiaxed grained Ti(C,N);
   (c) a layer of (TiAl)(CO);
   (d) a $\kappa$-$Al_2O_3$ layer;
   (e) a layer of (TiAl)(CO); and
   (f) a layer of columnar grained Ti(C,N).

19. The coated cemented carbide body of claim 18, further comprising:
   (g) an outer layer of TiN.

* * * * *